United States Patent
Pullela et al.

(10) Patent No.: US 10,181,869 B2
(45) Date of Patent: *Jan. 15, 2019

(54) METHOD AND SYSTEM FOR A CONFIGURABLE LOW-NOISE AMPLIFIER WITH PROGRAMMABLE BAND-SELECTION FILTERS

(71) Applicant: Maxlinear, Inc., Carlsbad, CA (US)

(72) Inventors: Raja Pullela, Carlsbad, CA (US); Wenjian Chen, Carlsbad, CA (US); Vamsi Paidi, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/887,618

(22) Filed: Feb. 2, 2018

(65) Prior Publication Data

US 2018/0159573 A1 Jun. 7, 2018

Related U.S. Application Data

(63) Continuation of application No. 15/483,064, filed on Apr. 10, 2017, now Pat. No. 9,887,719, which is a
(Continued)

(51) Int. Cl.
*H03F 1/56* (2006.01)
*H04B 1/16* (2006.01)
(Continued)

(52) U.S. Cl.
CPC .............. *H04B 1/16* (2013.01); *H03F 1/565* (2013.01); *H03F 3/195* (2013.01); *H03G 5/28* (2013.01); *H03F 2200/06* (2013.01); *H03F 2200/165* (2013.01); *H03F 2200/171* (2013.01); *H03F 2200/294* (2013.01); *H03F 2200/429* (2013.01); *H03F 2200/451* (2013.01);
(Continued)

(58) Field of Classification Search
CPC ......... H03F 2200/111; H03F 2200/294; H03F 2200/429; H03F 2203/7209; H04B 1/005
See application file for complete search history.

(56) References Cited

U.S. PATENT DOCUMENTS 5,032,801 A * 7/1991 Woo ..................... H03H 11/245
                   330/51
5,880,634 A * 3/1999 Babanezhad ....... H03F 3/45475
                   327/557

(Continued)

*Primary Examiner* — Duc M Nguyen
(74) *Attorney, Agent, or Firm* — McAndrews, Held & Malloy

(57) ABSTRACT

Methods and systems for a configurable low-noise amplifier with programmable band-selection filters may comprise a receiver with a low-noise amplifier (LNA) with first and second input terminals and differential output terminals; a low pass filter operably coupled to the LNA; a high pass filter operably coupled to the second input terminal of the LNA; and a signal source input coupled to the low pass filter and the high pass filter. The LNA may be operable to receive signals in a pass band of the high pass filter and a pass band of the low pass filter. The receiver may be operable to amplify input signals in the pass band of a first filter but not signals in the pass band of the second filter by operably coupling the second to ground.

20 Claims, 8 Drawing Sheets

Related U.S. Application Data continuation of application No. 15/094,658, filed on Apr. 8, 2016, now Pat. No. 9,621,117, which is a continuation of application No. 14/272,331, filed on May 7, 2014, now Pat. No. 9,312,821.

(60) Provisional application No. 61/820,210, filed on May 7, 2013.

(51) Int. Cl.
  *H03F 3/195* (2006.01)
  *H03G 5/28* (2006.01)
  *H04B 1/00* (2006.01)
  *H03H 7/01* (2006.01)

(52) U.S. Cl.
  CPC .... *H03F 2203/7209* (2013.01); *H03H 7/0115* (2013.01); *H04B 1/005* (2013.01)

(56) References Cited

U.S. PATENT DOCUMENTS

| | | | |
|---|---|---|---|
| 6,151,509 A * | 11/2000 | Chorey | H03F 3/72 455/102 |
| 6,674,337 B2 * | 1/2004 | Hashemi | H03F 1/223 330/126 |
| 7,142,833 B2 * | 11/2006 | Hibino | H03F 1/565 455/193.1 |
| 8,102,214 B2 * | 1/2012 | Park | H03F 1/223 330/291 |
| 8,175,566 B2 * | 5/2012 | Tasic | H03F 3/195 330/124 R |
| 8,195,119 B2 * | 6/2012 | Cassia | H03F 3/19 330/51 |
| 9,312,821 B2 * | 4/2016 | Pullela | H03F 3/19 |
| 9,325,553 B2 * | 4/2016 | Kaukovuori | H04B 1/0057 |
| 9,621,117 B2 * | 4/2017 | Pullela | H03F 3/195 |
| 2001/0011926 A1 * | 8/2001 | Adar | H03F 1/0261 330/126 |
| 2003/0219035 A1 * | 11/2003 | Schmidt | H01Q 1/241 370/478 |
| 2004/0232993 A1 * | 11/2004 | Yeh | H03F 3/72 330/295 |
| 2004/0246051 A1 * | 12/2004 | Hsu | H03F 3/189 330/252 |
| 2005/0195335 A1 * | 9/2005 | Gomez | H04N 5/46 348/707 |
| 2005/0197092 A1 * | 9/2005 | Darabi | H03G 3/3052 455/323 |
| 2005/0231290 A1 * | 10/2005 | Hung | H03F 1/223 330/311 |
| 2006/0227905 A1 * | 10/2006 | Kunysz | G01S 19/32 375/345 |
| 2011/0183685 A1 * | 7/2011 | Burton | G06F 21/316 455/456.1 |
| 2012/0178391 A1 * | 7/2012 | Kaltiokallio | H03F 1/3211 455/131 |

* cited by examiner

METHOD AND SYSTEM FOR A CONFIGURABLE LOW-NOISE AMPLIFIER WITH PROGRAMMABLE BAND-SELECTION FILTERS

CROSS-REFERENCE TO RELATED APPLICATIONS/INCORPORATION BY REFERENCE

This application is a continuation of application Ser. No. 15/483,064 filed on Apr. 10, 2017, which is a continuation of application Ser. No. 15/094,658 filed on Apr. 8, 2016, now U.S. Pat. No. 9,621,117, which is a continuation of application Ser. No. 14/272,331, filed on May 7, 2014, now U.S. Pat. No. 9,312,821, which makes reference to and claims priority to U.S. Provisional Application Ser. No. 61/820,210 filed on May 7, 2013, each of which is incorporated herein by reference in its entirety.

FIELD

Certain embodiments of the disclosure relate to wireless communication. More specifically, certain embodiments of the disclosure relate to a method and system for a configurable low-noise amplifier with programmable band-selection filters.

BACKGROUND

Low-noise amplifiers are often used in radio frequency (RF) applications, and are used to amplify very weak signals, often received from an antenna.

Further limitations and disadvantages of conventional and traditional approaches will become apparent to one of skill in the art, through comparison of such systems with the present invention as set forth in the remainder of the present application with reference to the drawings.

BRIEF SUMMARY

A system and/or method for a configurable low-noise amplifier with programmable band-selection filters substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a configurable low-noise amplifier with programmable band-selection filters. Exemplary aspects of the invention may comprise a low-noise amplifier (LNA) with a low pass filter operably coupled to a first input of the LNA and a high pass filter operably coupled to a second input terminal of the LNA. The low pass filter and the high pass filter may also be coupled to a signal source input. Signals may be received in a pass band of the high pass filter and a pass band of the low pass filter. Input signals in the pass band of the high pass filter (but not signals in the pass band of the low pass filter) may be amplified by operably coupling the first input of the LNA to ground and operably coupling the low pass filter to ground utilizing a shunt resistor. Input signals in the pass band of the low pass filter (but not signals in the pass band of the high pass filter) may be amplified by operably coupling the second input of the LNA to ground and operably coupling the high pass filter to ground utilizing a shunt resistor. A single-ended input may be received and a differential output signal may be generated at outputs of the LNA. The low pass filter may be operably coupled to the first input of the LNA and the high pass filter may be operably coupled to the second input of the LNA utilizing an array of switches. The high pass and low pass filters may be configurable. The semiconductor die may comprise a complementary metal-oxide semiconductor (CMOS) die. The low pass filter and the high pass filter may each comprise at least one inductor and at least one capacitor. A wideband, high frequency, or low frequency mode of the LNA may be configured based on a signal received from a received signal strength indicator (RSSI).

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figure 1:
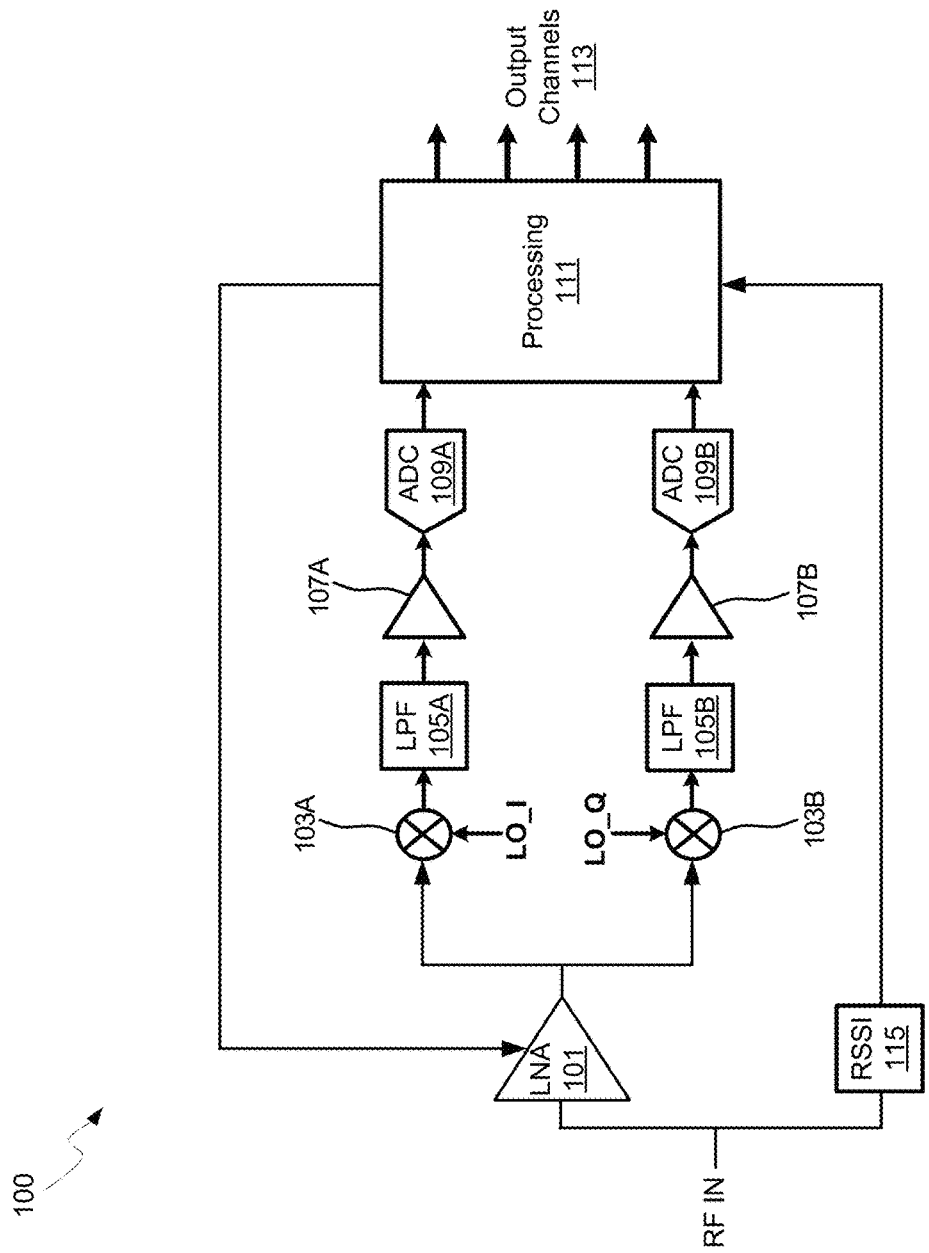
FIG. 1 is a diagram illustrating an example receiver with a differential low-noise-amplifier with programmable band selection filters, in accordance with an example embodiment of the disclosure.

FIG. 1 is a diagram illustrating an example receiver with a differential low-noise-amplifier with programmable band selection filters, in accordance with an example embodiment of the disclosure. Referring to FIG. 1, there is shown a receiver 100 comprising a pseudo-differential low-noise amplifier (LNA) 101, in-phase (I) and quadrature (Q) mixers 103A and 103B, local oscillator signals LO_I and LO_Q, gain stages 107A and 107B, analog-to-digital converters (ADCs) 109A and 109B, a processing module 111, and a receive signal strength indicator (RSSI) 115. There is also shown an input signal RF IN.

The LNA 101 may be operable to provide amplification to the input signal RF IN with the amplified signal being communicated to the mixers 103A and 103B. The LNA 101 may comprise a pseudo-differential LNA in that a single-ended input signal received by the LNA 101 may be output as an amplified differential signal without the need for a balun to convert to a differential signal. Furthermore, the LNA 101 may comprise programmable band-selection filters at the inputs to the LNA. The differential output signal may be communicated to the I and Q mixers 103A and 103B.

The mixers 103A and 103B may comprise circuitry that is operable to generate output signals at frequencies that are the sum and the difference between the input RF signal RF In and the local oscillator signal, which comprises either LO_I or LO_Q. The signal RF In may be down-converted to in-phase and quadrature signals in the receiver 100 utilizing the 90 degree phase difference LO signals LO_I and LO_Q. The frequency of LO_I and LO_Q may be configured such that it is centered within desired channels. The local oscillators signals LO_I And LO_Q may be generated by voltage-controlled oscillators in a phase-locked loop, for example, where the frequency of oscillation may be configured by a control voltage.

The low-pass filters 105A and 105B may comprise circuitry that is operable to attenuate signals above a corner frequency and allow signals below the corner frequency to pass. In this manner, sum frequency signals from the mixers 103A and 103B may be filtered while difference frequency signals may be allowed to pass through to the gain modules 107A and 107B.

The gain modules 107A and 107B may comprise amplifiers for amplifying the down-converted and filtered signals. The gain modules 107A and 107B may comprise configurable gain levels, and may be controlled by the processing module 111, for example. In another example scenario, the LNA 101 may comprise a conventional single-ended LNA and the gain modules 107A and 107B may comprise pseudo-differential LNAs, as described for the LNA 101 above.

The ADCs 109A and 109B may comprise circuitry that is operable to convert analog input signals to digital output signals. Accordingly, the ADCs 109A and 109B may receive baseband analog signals from the gain modules 107A and 107B and may generate digital signals to be communicated to the processing module 111. In another example scenario where the input signal, RF IN, is a digital signal, the ADCs 109A and 109B would then not be needed, and the processing of received signals would be in the digital domain.

The RSSI 115 may comprise suitable circuitry, logic, and/or code that may be operable detect the energy of all signals in the RF band. By detecting the signal conditions, based on receive signal strength of the desired signal, a different mode of the receiver 100 may be selected, as shown further with respect to FIGS. 5-7, which may maximize the signal-to-noise ratio (SNR) at the receiver 100 output. This algorithm can be implemented on-chip or in a host in which the receiver 100 is integrated (host not shown).

Figure 4:
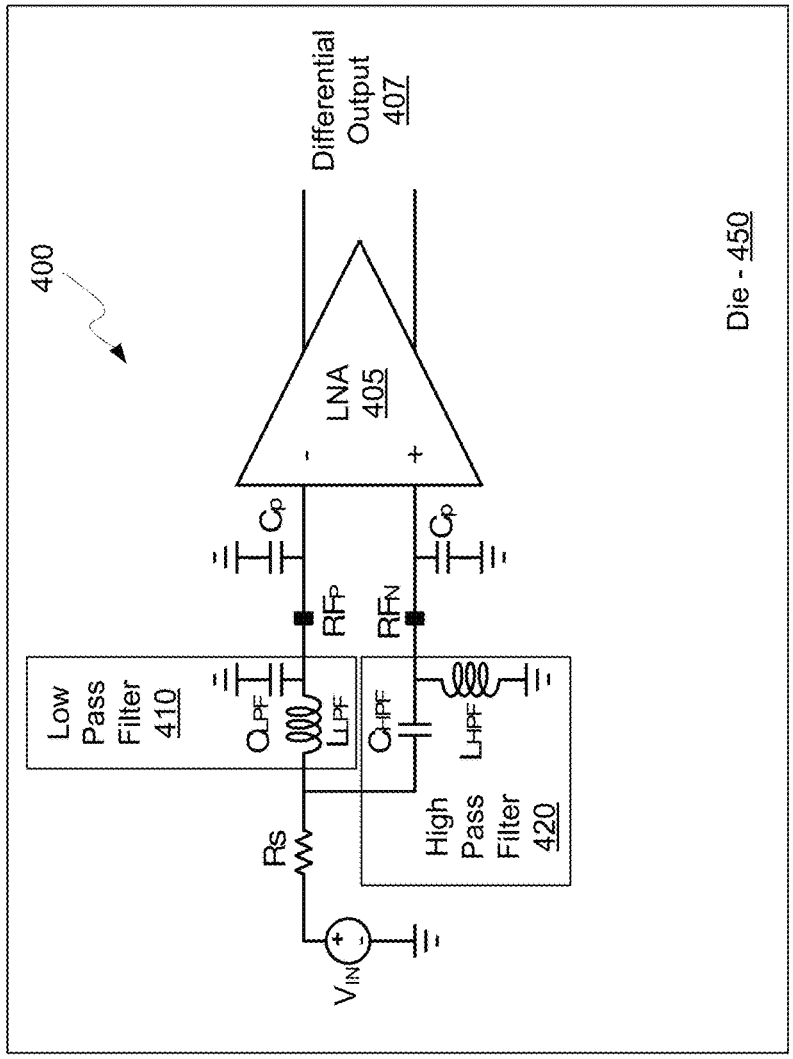
FIG. 4 illustrates a differential low-noise amplifier with programmable band-selection filters, in accordance with an example embodiment of the disclosure.
Figure 5:
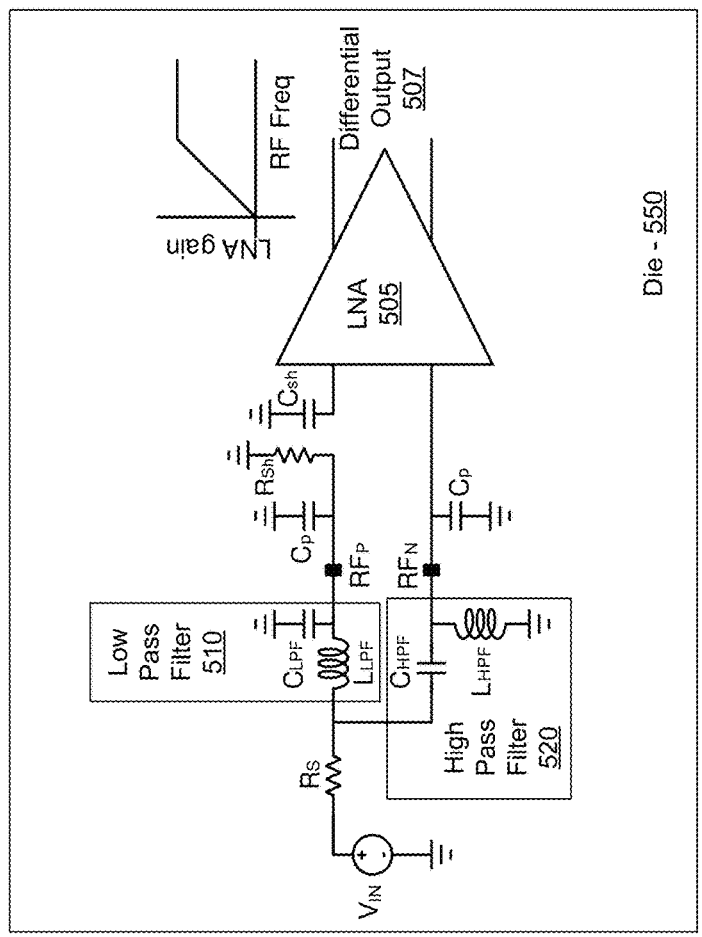
FIG. 5 illustrates a differential low-noise amplifier with low-frequency termination, in accordance with an example embodiment of the disclosure.
Figure 6:
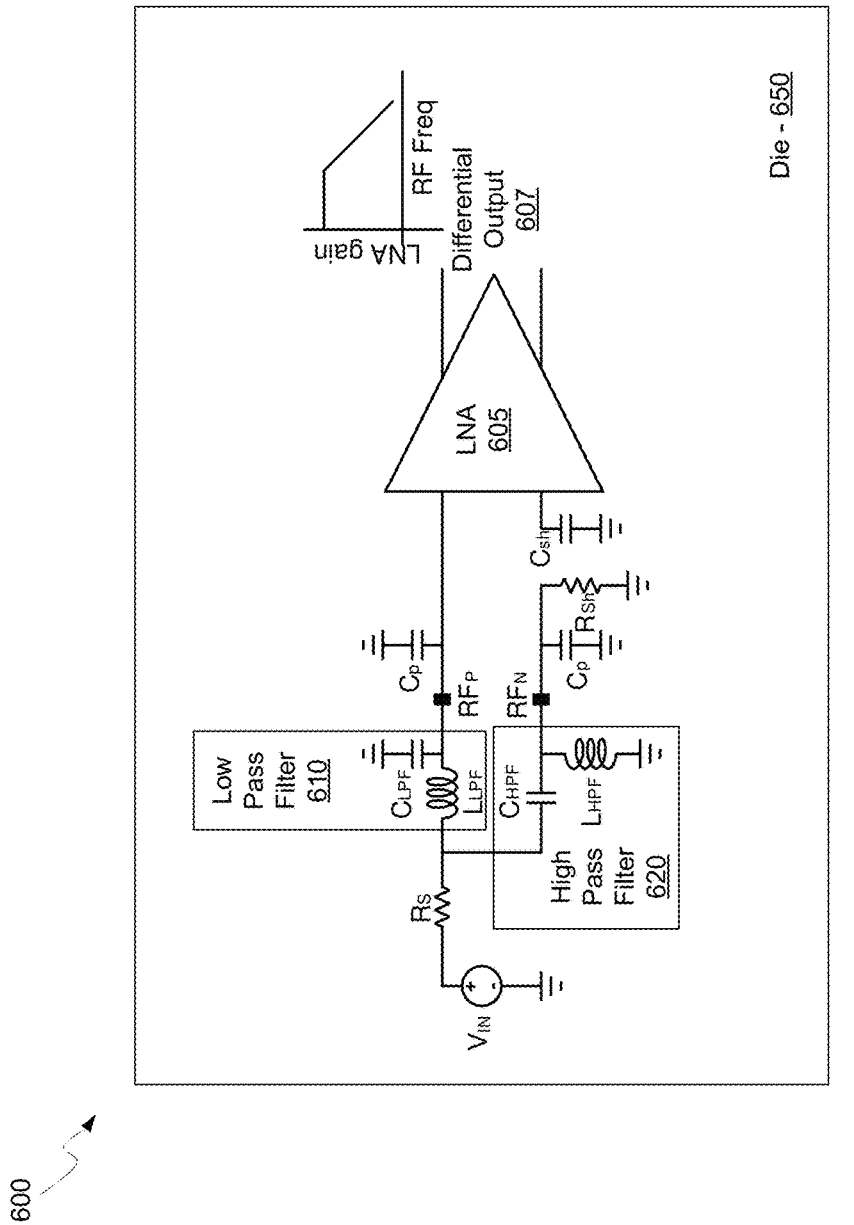
FIG. 6 illustrates a differential low-noise amplifier with high-frequency termination, in accordance with an example embodiment of the disclosure.

The processing module 111 may comprise a processor that is operable to control the functions of the receiver 200 and may process received baseband signals to demodulate, deinterlace, and/or perform other processing techniques to the data. The processing module 111 may also receive signals from the RSSI 115 and configure the LNA 101 to be in a wideband, high pass, or low pass mode, which are shown in FIGS. 4-6, respectively.

In an example scenario, the receiver 100 may be operable to receive and process RF signals. In terrestrial, cable or satellite applications, single-ended RF input to the chip is desirable as it eliminates the need for an external balun, reducing the cost of the overall system implementation. However, single-ended topologies are generally inferior to their differential counterparts in their distortion performance, especially the even order components. In high-end applications where performance is critical and cost is less of a limitation, devices with baluns and the increase in costs due to the baluns are acceptable. Unfortunately, existing topologies for low noise amplifiers (LNAs) are not easily configurable between single-ended and differential modes, and performance sacrifices have to be made, if the same chip or design is to be used in both differential and single-ended modes.

Figure 2:
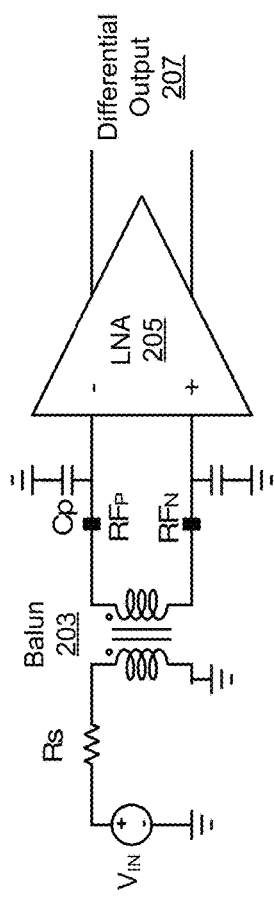
FIG. 2 is a schematic of a differential low-noise amplifier utilizing a balun, in accordance with an example embodiment of the disclosure.

One possible configuration is to use a simple differential amplifier and drive it in a pseudo-differential fashion to convert it in to a single-ended amplifier. While this is relatively easy in principle, performance may degrade significantly due to the following reasons: 1) The impedance looking in to the source from the RF input to the chip in the single-ended mode goes up by a factor of two, compared to the differential case, where RF_P and RF_N are looking into the balun as shown in FIG. 2. Capacitance associated with the RF input trace, components, pads, on-chip attenuator and parasitics (Cp) shown in FIG. 2 degrades the bandwidth of the RF input in wideband designs, causing NF and S11 degradation; and 2) Single-ended signal design suffers from poor IP2 performance. IP3 and P1 dB also degrade due to higher signal swing on the single-ended RF input compared to the differential case.

FIG. 2 is a schematic of a differential low-noise amplifier utilizing a balun, in accordance with an example embodiment of the disclosure. Referring to FIG. 2, there is shown receiver front-end 200 comprising an input voltage source $V_{IN}$, a source resistance, a balun 203, an LNA 205, and a differential output 207. There are also shown parasitic capacitances CP and input resistances $RF_P$ and $RF_N$ at the inputs to the LNA 205.

The balun 203 may comprise inductive coils with mutual inductance where a first terminal of one coil provides an input terminal and the other terminal of the first coil is coupled to ground, thereby providing a single-ended input. The terminals of the second coil provide a differential output that may be coupled to the inputs of the LNA 205. The differential input configuration may enable a lower voltage swing at each input to the LNA 205.

The LNA 205 may comprise circuitry that is operable to amplify the received differential signal received at its input terminals and generate the differential output 207. In this scenario, utilizing the balun 203 to provide a differential signal for the LNA 205, and with the source resistance $R_S$ and parasitic capacitances $C_P$, the input bandwidth is given by $(R_S/2)*C_P$.

Figure 3:
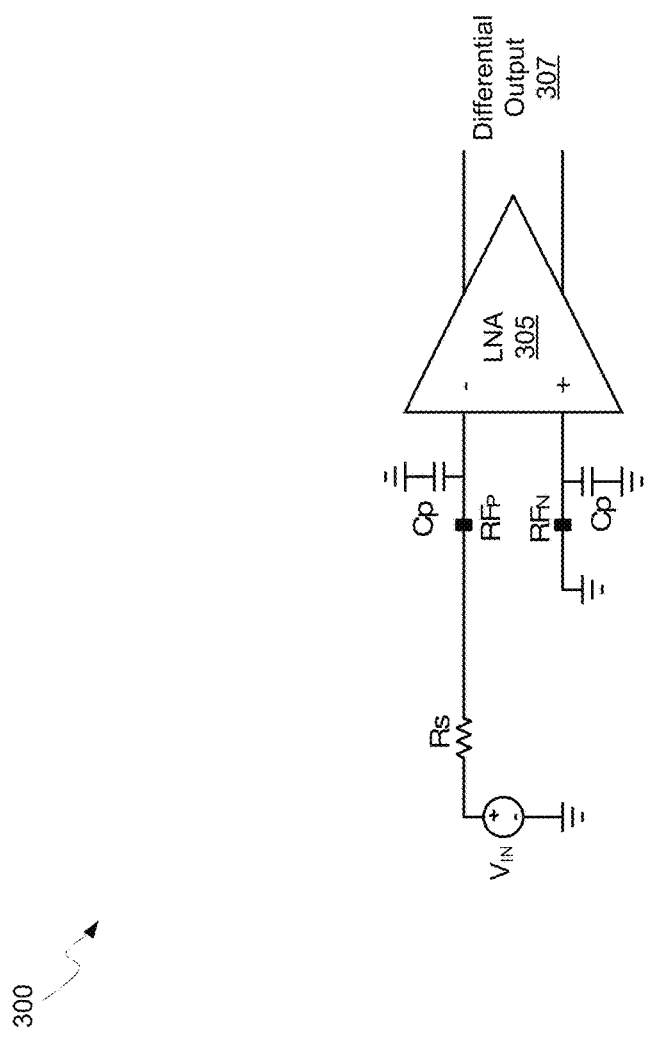
FIG. 3 illustrates a pseudo-differential low-noise amplifier, in accordance with an example embodiment of the disclosure.

FIG. 3 illustrates a pseudo-differential low-noise amplifier, in accordance with an example embodiment of the disclosure. Referring to FIG. 3, there are shown a pseudo-differential LNA 300 comprising an input source $V_{IN}$, a series source resistance $R_S$, parasitic capacitors $C_P$, an LNA 305, and a differential output 307. The pseudo-differential input configuration comprises a grounded input and the input signal $V_{IN}$ being applied at the other input. While this configuration does generate a differential output signal from a single-ended input, it suffers from the aforementioned performance degradation, such as increased input resistance and increased S11 microwave reflection.

The input resistance of the LNA 305 is indicated by $RF_P$ and $RF_N$ in FIG. 3, and the input bandwidth may be given by $R_S*C_P$. This bandwidth limitation may be improved by adding a shunt inductor at $RF_P$, but this greatly degrades the low frequency gain and is therefore, not desirable. Furthermore, the input voltage swing is higher in this configuration.

FIG. 4 illustrates a differential low-noise amplifier with programmable band-selection filters, in accordance with an example embodiment of the disclosure. Referring to FIG. 4, there is shown a differential LNA circuit 400 comprising a signal source input comprising a voltage source $V_{IN}$ and a series source resistance $R_S$, parasitic capacitors $C_P$, an LNA 405, and a differential output 407. There are also shown a low pass filter 410 at one input of the LNA 405 and a high pass filter 420 at another input to the LNA 405. In an example scenario, the LNA circuit 400 may be fully integrated on an integrated circuit die 450, or a portion of the LNA circuit 400 may be off-chip.

The low pass filter 410 may comprise a series inductor $L_{LPF}$ and a shunt capacitor $C_{LPF}$, and the high pass filter 420 may comprise a series capacitor $C_{HPF}$ and a shunt inductor $L_{HPF}$. These inductors and capacitors may comprise fixed or variable impedances and/or may comprise a switchable array of inductors and capacitors.

In the configuration shown in FIG. 4, low frequencies pass through the low pass filter 410 to the − terminal (P side) of the LNA 405, while the high frequencies pass through the high pass filter 420 to the + terminal (N side) of the LNA 405. This allows an all-pass response, enabling the LPF+HPF configuration on the LNA inputs to provide a broad band impedance match across the frequency band of interest This matching topology allows the addition of the shunt inductor $L_{HPF}$ on the N side to counter the effect of the capacitance $C_P$, without affecting the low frequency gain through the P side. This ensures good S11 and noise factor over a broad range of frequencies. It should be noted that the differential inputs of the LNA 405 are used as a summing device for signals going through the low pass and high pass filters 410 and 420, creating an all-pass response at the LNA output 407 (Mode I).

FIG. 5 illustrates a differential low-noise amplifier with low-frequency termination, in accordance with an example embodiment of the disclosure. Referring to FIG. 5, there is shown a differential LNA circuit 500 comprising a signal source input that comprises a voltage source $V_{IN}$ and a series source resistance $R_S$, parasitic capacitors $C_P$, an LNA 505, a shunt capacitor $C_{sh}$, and a differential output 507. There is also shown a low pass filter 510 at one input of the LNA 505 and a high pass filter 520 at another input to the LNA 505. In an example scenario, the LNA circuit 500 may be fully integrated on an integrated circuit die 550, or a portion of the LNA circuit 500 may be off-chip.

As with the low and high pass filters of FIG. 4, the low pass filter 510 may comprise a series inductor $L_{LPF}$ and a shunt capacitor $C_{LPF}$, and the high pass filter 520 may comprise a series capacitor $C_{HPF}$ and a shunt inductor $L_{LPF}$. These inductors and capacitors may comprise fixed or variable impedances and/or may comprise a switchable array of inductors and capacitors.

A low-frequency termination configuration is shown in FIG. 5, with the P side of the RF path shunted to ground by the shunt resistor $R_{Sh}$ and the P side input of the LNA 505 coupled to ground via the shunt capacitor $C_{sh}$, as shown in FIG. 5. In this alternative embodiment of the previously described matching topology, the low frequency signals may be terminated before they hit the LNA 505 by the shunt resistor $R_{Sh}$. In instances where the receiver is tuned to a channel in the high-pass filter range (mode II), low frequency signals may be significantly attenuated and performance of the radio greatly improves in situations where large undesired signals are present at lower frequencies.

In an example scenario, the configuration shown in FIG. 4 may be changed to that shown in FIG. 5 utilizing switches in the RF paths. For example, a switch may be activated to couple the P side of the RF input path to the shunt resistor to ground and the P side input to the LNA may be coupled to ground via another switch, as is shown further with respect to FIG. 7.

The plot to the upper right of the circuit schematic of FIG. 5 illustrates the frequency response of the LNA configuration 500 showing attenuated response at low frequency and flat gain at high frequencies.

FIG. 6 illustrates a differential low-noise amplifier with high-frequency termination, in accordance with an example embodiment of the disclosure. Referring to FIG. 6, there is shown a differential LNA circuit 600 comprising a signal source input that comprises a voltage source $V_{IN}$ and a series source resistance $R_S$, parasitic capacitors $C_P$, an LNA 605, a shunt capacitor $C_{sh}$, and a differential output 607. There is also shown a low pass filter 610 at one input of the LNA 605 and a high pass filter 620 at another input to the LNA 605. In an example scenario, the LNA circuit 600 may be fully integrated on an integrated circuit die 650, or a portion of the LNA circuit 600 may be off-chip.

As with the low and high pass filters of FIG. 4, the low pass filter 610 may comprise a series inductor $L_{LPF}$ and a shunt capacitor $C_{LPF}$, and the high pass filter 620 may comprise a series capacitor $C_{HPF}$ and a shunt inductor $L_{HPF}$. These inductors and capacitors may comprise fixed or variable impedances and/or may comprise a switchable array of inductors and capacitors.

A high-frequency termination configuration is shown in FIG. 6, with the N side of the RF path shunted to ground by the shunt resistor $R_{Sh}$ and the N side input of the LNA 605 coupled to ground via the shunt capacitor $C_{sh}$, as shown in FIG. 6. In this alternative embodiment of the previously described matching topology, high frequency signals may be terminated before they hit the LNA 605 by the shunt resistor $R_{Sh}$. In instances where the receiver is tuned to a channel in the low-pass filter range (mode III), high frequency signals may be significantly attenuated and performance of the radio greatly improves in situations where large undesired signals are present at higher frequencies.

In an example scenario, the configuration shown in FIG. 4 may be changed to that shown in FIG. 6 utilizing switches in the RF paths. For example, a switch may be activated to couple the N side of the RF input path to the shunt resistor to ground and the N side input to the LNA may be coupled to ground via another switch.

The plot to the upper right of the circuit schematic of FIG. 6 illustrates the frequency response of the LNA configuration 600 showing attenuated response at high frequency and flat gain at low frequencies.

Figure 7:
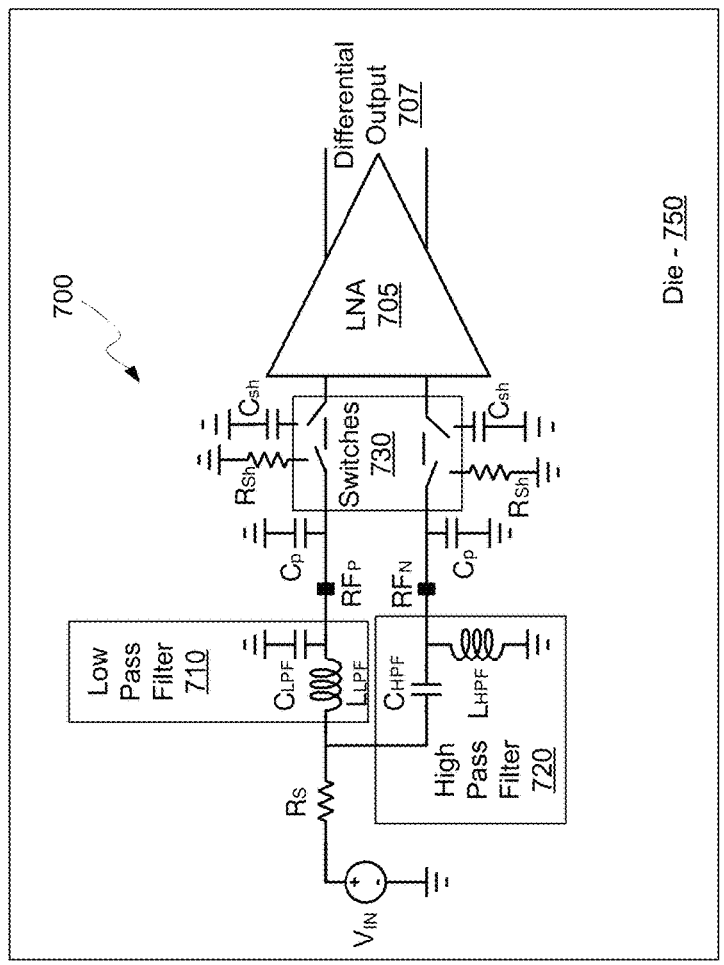
FIG. 7 illustrates configurable mode selection for a low-noise amplifier, in accordance with an example embodiment of the disclosure.

FIG. 7 illustrates configurable mode selection for a low-noise amplifier, in accordance with an example embodiment of the disclosure. Referring to FIG. 7, there is shown configurable differential LNA circuitry 700 comprising a signal source input that comprises a voltage source $V_{IN}$ and a series source resistance $R_S$, parasitic capacitors $C_P$, an LNA 705, switches 730, and a differential output 707. There are also shown a low pass filter 710 at one input of the LNA 705 and a high pass filter 720 at another input to the LNA 705. In an example scenario, the LNA circuitry 700 may be fully integrated on an integrated circuit die 750, or a portion of the LNA circuitry 700 may be off-chip.

As with the low and high pass filters of FIGS. 4-6, the low pass filter 710 may comprise a series inductor $L_{LPF}$ and a shunt capacitor $C_{LPF}$, and the high pass filter 720 may comprise a series capacitor $C_{HPF}$ and a shunt inductor $L_{HPF}$. These inductors and capacitors may comprise fixed or variable impedances and/or may comprise a switchable array of inductors and capacitors.

The switches 730 may comprise individually-addressable switches, such as CMOS transistors, for example, in the RF paths, for switching them to ground via shunt resistors or for switching LNA input terminals to ground. In an example scenario, for lower frequency operation, the switches 730 may be closed on the P side path of the LNA 705, thereby coupling signals that pass through the low pass filter 710 to the LNA 705, whereas the switches in the N side path may be switched to the shunt resistor $R_{Sh}$ on the input signal side and to ground at the LNA 705 input, thereby corresponding to FIG. 6.

Alternatively, for high frequency operation, the switches 730 may be closed on the N side path of the LNA 705, thereby coupling signals that pass through the high pass filter 720 to the LNA 705, whereas the switches in the P side path may be switched to the shunt resistor $R_{Sh}$ on the input signal side and to ground at the LNA 705 input, thereby corresponding to FIG. 5. The mode that results in the highest SNR for a desired channel or frequency may be selected utilizing an RSSI, such as described with respect to FIG. 1.

In addition, switches may be integrated in the low pass filter 710 and the high pass filter 720 for configuring the pass frequency and/or bandwidth in each filter. The switches 730 may be controlled by a processor, such as the processing module 111 shown in FIG. 1, for example.

Figure 8:
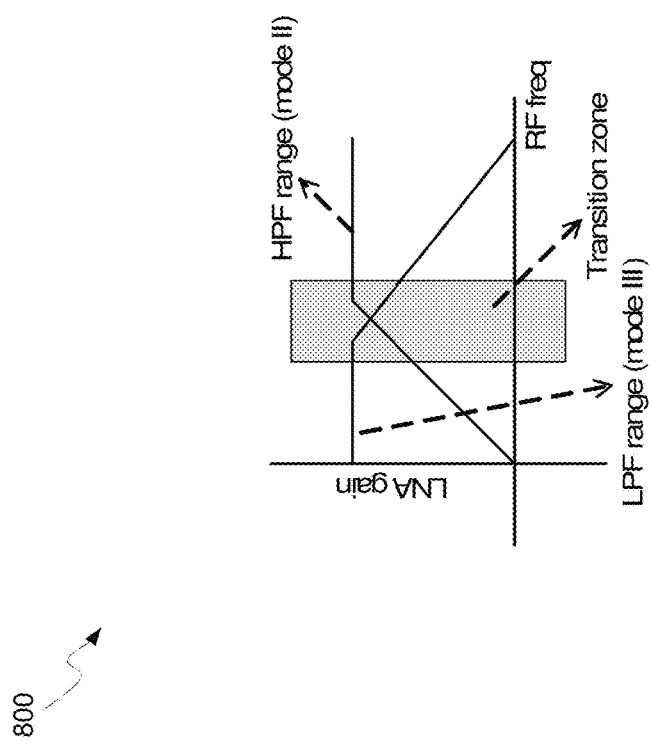
FIG. 8 is a plot of low-noise frequency response, in accordance with an example embodiment of the disclosure.

FIG. 8 is a plot of low-noise frequency response, in accordance with an example embodiment of the disclosure. Referring to FIG. 8, there is shown a plot 800 of LNA gain versus frequency, illustrating the different modes of the LNA as described in FIGS. 4-7. As shown in the plot 800, in Mode II, where the low pass filter is shunted to ground through a shunt resistor and the associated input terminal of the LNA is shorted to ground, as shown in FIG. 5, the LNA gain is low at low frequencies and transitions to a high gain in the transition zone.

Similarly, in Mode III, where the high pass filter is shunted to ground through a shunt resistor and the associated input terminal of the LNA is shorted to ground, as shown in FIG. 6, the LNA gain is high at low frequencies and drops off in the transition zone.

In an embodiment of the disclosure, a method and system may comprise a low-noise amplifier (LNA) with a low pass filter operably coupled to a first input of the LNA and a high pass filter operably coupled to a second input terminal of the LNA. The low pass filter and the high pass filter may also be coupled to a signal source input. Signals may be received in a pass band of the high pass filter and a pass band of the low pass filter. Input signals in the pass band of the high pass filter (but not signals in the pass band of the low pass filter) may be amplified by operably coupling the first input of the LNA to ground and operably coupling the low pass filter to ground utilizing a shunt resistor.

Input signals in the pass band of the low pass filter (but not signals in the pass band of the high pass filter) may be amplified by operably coupling the second input of the LNA to ground and operably coupling the high pass filter to ground utilizing a shunt resistor. A single-ended input may be received and a differential output signal may be generated at outputs of the LNA. The low pass filter may be operably coupled to the first input of the LNA and the high pass filter may be operably coupled to the second input of the LNA utilizing an array of switches.

The high pass and low pass filters may be configurable. The semiconductor die may comprise a complementary metal-oxide semiconductor (CMOS) die. The low pass filter and the high pass filter may each comprise at least one inductor and at least one capacitor. A wideband, high frequency, or low frequency mode of the LNA may be configured based on a signal received from a received signal strength indicator (RSSI).

Other embodiments may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a configurable low-noise amplifier with programmable band-selection filters.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A semiconductor device, the device comprising:
a receiver comprising:
a low-noise amplifier (LNA) with first and second input terminals, said LNA being configurable in a wideband mode, a high frequency mode, and a low frequency mode;
a low pass filter with first and second terminals, the second terminal operably coupled to the first input terminal of the LNA;
a high pass filter with first and second terminals, the second terminal operably coupled to the second input terminal of the LNA; and
a signal source input coupled to the first terminal of the low pass filter and the first terminal of the high pass filter,
wherein said LNA is configured in said wideband mode, said high frequency mode, or said low frequency mode based on a measurement of an output of said LNA.

2. The device according to claim 1, wherein the receiver is operable to amplify input signals in a pass band of the high pass filter but not signals in a pass band of the low pass filter by operably coupling the first input of the LNA to ground and the second terminal of the low pass filter to ground utilizing a shunt resistor.

3. The device according to claim 1, wherein the receiver is operable to amplify input signals in a pass band of the low pass filter but not signals in a pass band of the high pass filter by operably coupling the second input of the LNA to ground and the second terminal of the high pass filter to ground utilizing a shunt resistor.

4. The device according to claim 1, wherein the receiver is operable to receive a single-ended input and generate a differential output.

5. The device according to claim 1, wherein an array of switches is utilized for operably coupling the second terminal of the low pass filter to the first input of the LNA and the second terminal of the high pass filter to the second input of the LNA.

6. The device according to claim 1, wherein the high pass and low pass filters are configurable.

7. The device according to claim 1, wherein the LNA is integrated on a complementary metal-oxide semiconductor (CMOS) die.

8. The device according to claim 1, wherein the low pass filter and the high pass filter each comprise at least one inductor and at least one capacitor.

9. The device according to claim 1, wherein a measured receive signal strength indicator (RSSI) signal is communicated to a processor that configures the mode of the LNA.

10. A method for communication, the method comprising:
in a receiver comprising:
a low pass filter;
a high pass filter;
a signal source input; and
a low-noise amplifier (LNA) with first and second input terminals, the low pass filter operably coupled to the first input terminal, and the high pass filter operably coupled to the second input terminal, wherein the low pass filter and the high pass filter are also coupled to the signal source input:
configuring the LNA in a wideband mode, a high frequency mode, or a low frequency mode based on a measurement of an output of said LNA.

11. The method according to claim 10, comprising amplifying input signals in a pass band of the high pass filter but not signals in a pass band of the low pass filter by operably coupling the first input of the LNA to ground and operably coupling the low pass filter to ground utilizing a shunt resistor.

12. The method according to claim 10, comprising amplifying input signals in a pass band of the low pass filter but not signals in a pass band of the high pass filter by operably coupling the second input of the LNA to ground and operably coupling the high pass filter to ground utilizing a shunt resistor.

13. The method according to claim 10, comprising receiving a single-ended input and generating a differential output signal at outputs of the LNA.

14. The method according to claim 10, comprising operably coupling the low pass filter to the first input of the LNA and the high pass filter to the second input of the LNA utilizing an array of switches.

15. The method according to claim 10, wherein the high pass and low pass filters are configurable.

16. The method according to claim 10, wherein the LNA is integrated on a complementary metal-oxide semiconductor (CMOS) die.

17. The method according to claim 10, wherein the low pass filter and the high pass filter each comprise at least one inductor and at least one capacitor.

18. A semiconductor device comprising:
a receiver comprising:
a low pass filter;
a high pass filter; and
a low-noise amplifier (LNA) with first and second input terminals, the LNA comprising a low frequency mode, a high frequency mode, and a wideband mode, a mode of said LNA being configurable based on a measurement of an output of said LNA, wherein:
the wideband mode comprises the low pass filter coupled to the first input of the LNA and the high pass filter coupled to the second input of the LNA;
the low frequency mode comprises the low frequency filter coupled to the first input of the LNA, the high pass filter shunted to ground utilizing a shunt resistor, and the second input of the LNA coupled to ground; and
the high frequency mode comprises the high frequency filter coupled to the second input of the LNA, the low pass filter shunted to ground utilizing a shunt resistor, and the first input of the LNA coupled to ground.

19. The method according to claim 18, comprising receiving a single-ended input and generating a differential output signal at outputs of the LNA.

20. The method according to claim 18, comprising operably coupling the low pass filter to the first input of the LNA and the high pass filter to the second input of the LNA utilizing an array of switches.

* * * * *